US009030212B2

(12) United States Patent
Karenowska et al.

(10) Patent No.: US 9,030,212 B2
(45) Date of Patent: May 12, 2015

(54) TARGET SENSOR

(71) Applicant: Oxford RF Sensors Limited, Oxford (GB)

(72) Inventors: Alexy Davison Karenowska, Oxford (GB); Peter Wherritt, Abingdon (GB); Martin Roy Harrison, Brackley (GB); John Francis Gregg, Oxford (GB)

(73) Assignee: Salunda Limited (GB)

( * ) Notice: Subject to any disclaimer, the term of this patent is extended or adjusted under 35 U.S.C. 154(b) by 243 days.

(21) Appl. No.: 13/630,880

(22) Filed: Sep. 28, 2012

(65) Prior Publication Data
US 2013/0076373 A1   Mar. 28, 2013

(30) Foreign Application Priority Data
Sep. 28, 2011   (GB) .................................. 1116727.7

(51) Int. Cl.
*G01R 27/28* (2006.01)
*F01D 21/00* (2006.01)
*G01B 7/14* (2006.01)
*H03K 17/95* (2006.01)
*F01D 21/04* (2006.01)

(52) U.S. Cl.
CPC ................ *F01D 21/003* (2013.01); *G01B 7/14* (2013.01); *H03K 17/9545* (2013.01); *F01D 21/04* (2013.01); *H03K 2017/9527* (2013.01); *F05D 2260/80* (2013.01); *F05D 2270/804* (2013.01)

(58) Field of Classification Search
CPC ........ G01R 27/28; G01R 27/32; G01R 13/30; G01R 13/342; G01R 15/09
USPC ..................................................... 324/603, 602
See application file for complete search history.

(56) References Cited

U.S. PATENT DOCUMENTS

| 3,780,859 | A | | 12/1973 | Scherf et al. |
| 3,853,064 | A | | 12/1974 | McCracken |
| 5,012,206 | A | | 4/1991 | Tigges |
| 5,365,787 | A | | 11/1994 | Hernandez et al. |
| 5,519,317 | A | | 5/1996 | Guichard et al. |
| 5,701,082 | A | * | 12/1997 | Rogers .......................... 324/628 |

(Continued)

FOREIGN PATENT DOCUMENTS

| DE | 33 05 546 A1 | 8/1984 |
| DE | 10 2006 019393 | 10/2007 |

(Continued)

OTHER PUBLICATIONS

UK Search Report dated Dec. 5, 2011 for Application No. GB1116727.7.

(Continued)

*Primary Examiner* — Arleen M Vazquez
*Assistant Examiner* — Dominic Hawkins
(74) *Attorney, Agent, or Firm* — Brinks Gilson & Lione

(57) ABSTRACT

Target sensor comprising: sensor probe having a resonance frequency that changes as the separation of the sensor probe and a target changes. Oscillator arranged to apply a radio frequency (RF) signal to the sensor probe, the oscillator having: control circuitry configured to regulate the frequency of the RF signal applied to the sensor probe to below the resonance frequency of the sensor probe. Detector arranged to detect an electrical characteristic of the oscillator that varies with the impedance of the sensor probe indicating an interaction of the sensor probe with the target.

18 Claims, 6 Drawing Sheets

(56) References Cited

U.S. PATENT DOCUMENTS

| | | | |
|---|---|---|---|
| 6,166,551 A * | 12/2000 | Scott et al. | 324/637 |
| 6,191,580 B1 | 2/2001 | Guichard | |
| 6,239,593 B1 | 5/2001 | Burkhardt et al. | |
| 7,215,129 B1 | 5/2007 | Andarawis et al. | |
| 2004/0155666 A1 | 8/2004 | Kesil et al. | |
| 2005/0020967 A1 * | 1/2005 | Ono | 604/22 |
| 2005/0088171 A1 | 4/2005 | Gualtieri | |
| 2007/0001663 A1 | 1/2007 | Hrubes | |
| 2007/0200562 A1 | 8/2007 | Shimomura et al. | |
| 2007/0268014 A1 | 11/2007 | Shimomura et al. | |
| 2008/0054891 A1 * | 3/2008 | Dobsky | 324/207.26 |
| 2009/0143933 A1 | 6/2009 | Kawaura et al. | |
| 2010/0033159 A1 * | 2/2010 | Tateishi et al. | 324/71.1 |
| 2010/0106027 A1 | 4/2010 | Jaeger | |
| 2010/0213929 A1 | 8/2010 | Gregg et al. | |
| 2011/0208451 A1 * | 8/2011 | Champlin | 702/63 |
| 2012/0019255 A1 * | 1/2012 | Rea et al. | 324/436 |
| 2012/0306513 A1 * | 12/2012 | Stradinger | 324/693 |

FOREIGN PATENT DOCUMENTS

| | | |
|---|---|---|
| EP | 0 399 563 A2 | 11/1990 |
| GB | 1 066 057 | 4/1967 |
| GB | 1 118 235 A | 6/1968 |
| JP | H10-281806 | 10/1998 |
| WO | WO 01/92817 A1 | 12/2001 |
| WO | WO 2009/034305 | 3/2009 |
| WO | WO 2010/082035 | 7/2010 |
| WO | WO 2010/082035 A1 | 7/2010 |
| WO | WO 2012/110756 A1 | 8/2012 |

OTHER PUBLICATIONS

Extended European Search Report, including European Search Report and European Search Opinion, dated Nov. 12, 2012 for EP Application No. 12 18 6718.

* cited by examiner (a)

(b)

(a)

(b)

TARGET SENSOR

FIELD OF THE INVENTION

The present invention relates to a target sensor and in particular a rotor blade sensor especially in turbines.

BACKGROUND OF THE INVENTION

Under normal operating conditions, the radial and axial position(s) of the turbine blade(s) of an aeroengine jet turbine vary over a range of up to several millimeters relative to their position when the engine is cold and unloaded. Extreme radial and axial shifts and/or overspeeding of the turbine (i.e. higher than expected rates of revolution $\omega_r$) can be symptomatic of a reduction in the performance of the engine and, under certain circumstances, a degradation in its mechanical integrity. Accordingly, it is desirable to monitor the speed and position of the turbine blades relative to the engine casing in such a way that abnormal conditions may be detected within several milliseconds of their appearance, and the appropriate control actions can be implemented to bring the engine back into a more desirable operating regime and/or minimize the risk of mechanical damage.

One means to implement such a monitoring system is to install a sensor in the engine casing capable of a) detecting the presence/absence of the turbine blades b) measuring the blade pass rate, from which the rotational speed of the turbine may be inferred.

In the context of such a measurement, two quantities are important: the radial distance between the blade tips and the turbine casing (commonly referred to as the "blade-tip clearance"), and the axial position of the turbine blades relative to a fixed point on the casing. The latter may be quantified in terms of an axial offset $d_a$ between the turbine blades and a fixed point on the turbine casing defined such that when the engine is cold and unloaded $d_a=0$ (see FIG. 1(a)).

The radial blade tip to casing distance $d_r$ takes a maximum value when the engine is cold and unloaded and reduces under load as a result of the combined effects of heating and centripetal acceleration of the blades. Axial shift of the blades is due to the displacement of the turbine under load. Relative to its "neutral" position in the cold, static engine, the majority of the axial shift of the turbine is toward the rear of the casing (negative shift), but a small displacement toward the front of the engine (positive shift) is also possible (see FIG. 1(b)).

A case mounted instrument capable of meeting the demands of blade sensing should preferably:

Have sufficient range to reliably detect the turbine blades when both axial shift and radial displacement are taken into consideration.
Achieve good immunity to noise and robustness to the effects of a hostile, varying temperature environment.
Achieve in-situ validation. That is, be equipped with the means to verify unambiguously that the sensor system is functioning normally.

Conventional position sensor technologies traditionally employed for the detection of moving metallic targets (for example variable capacitance sensors, optical sensors, and eddy current devices) are unable to satisfy all of the above.

One existing attempt at the turbine blade-tip detection problem involves mounting an inductive sensor element (a coil) in the casing of the engine connected to a specially designed electronic controller (see for example US2010213929, WO2010082035 and associated applications) to drive the sensor element at a resonance frequency. In this scheme, the position of the blades is established by measuring changes to the radiofrequency (100 kHz to several hundred MHz) impedance of the inductive element which occur as a result of its interaction with the blade tips.

Such systems have been developed and have been optimized for accurate, quantitative measurements of the blade-tip clearance $d_r$ over a relatively restricted range of axial offset values $d_a$; the underlying motivation being the improvement in fuel efficiency which is known to be achievable if $d_r$ can be controlled.

However, if the requirement is not to quantify the distance $d_r$ but to simply to detect the presence and speed of the blade tips: i.e. to confirm that $d_r$, $d_a$ and $\omega_r$ lie within certain "normal" operating ranges, the optimization exercise is significantly different: range rather than measurement accuracy is paramount. Accordingly, instrumentation schemes capable of delivering good performance in distance measurement applications typically fail to meet the demands of detection and speed sensing especially for the mid- and long-range detection and speed sensing of electrically conductive (though not necessarily metallic) rotor blades.

US2005/0088171 describes an eddy current sensor that drives a coil at its resonance frequency and then uses frequency demodulation to detect changes in that resonance frequency brought about by passing turbine blades. Whilst such a proximity sensor may detect fast moving blades, its sensitivity and range is low.

Therefore, there is required a rotor blade sensor that overcomes these problems.

SUMMARY OF THE INVENTION

Against this background and in accordance with a first aspect there is provided a target sensor comprising: a sensor probe having a resonance frequency that changes as the separation of the sensor probe and a target changes; an oscillator arranged to apply a radio frequency (RF), signal to the sensor probe, the oscillator having: control circuitry configured to regulate the frequency of the RF signal applied to the sensor probe to below the resonance frequency of the sensor probe; and a detector arranged to detect an electrical characteristic of the oscillator that varies with the impedance of the sensor probe indicating an interaction of the sensor probe with the target. Such an arrangement allows improved sensitivity and range to be achieved in comparison with prior-art technologies.

The target sensor may detect several targets as they pass and provide a blade-tip clearance indication and/or an indication of mechanical failure. The speed of rotation or absolute speed of target may also be detected. The oscillator and detector may be part of the same circuit or separate.

Optionally, the target sensor may further comprise a circuit arranged to determine the resonance frequency of the sensor probe. This allows the circuit to be calibrated for different conditions or following a change made to the targets.

Optionally, the control circuitry may be further configured to regulate the frequency of the RF signal to a constant frequency. Driving the sensor probe at a constant frequency below its resonance frequency allows a larger signal to be detected, therefore improving sensitivity.

Preferably, the detector may be an amplitude modulation (AM) detector. This AM detection may occur at the driving frequency. Therefore, the detector may include an amplitude demodulator.

Optionally, the electrical characteristic may be selected from the group consisting of: frequency; amplitude; quality factor, Q; current; and voltage. Other characteristics or electrical properties may be used.

The control circuitry is configured to regulate the applied RF signal below the resonance frequency of the sensor probe both in the absence and presence of interaction with a target and under all operating conditions of the sensor system. As detailed later, such an arrangement leads to an advantageous improvement in sensitivity over prior-art technologies.

Preferably, the control circuitry may be configured to regulate the applied RF signal between 100 KHz and 250 MHz. Other frequencies may be used such as below 400 MHz, for example.

Preferably the control circuitry is configured to regulate the applied RF signal at a frequency which is, for (preferably) all operating conditions, and both in the presence and absence of interaction between the sensor probe and a target, simultaneously: (a) not less than $\omega_0/Q$ below the resonance frequency $\omega_0$ of the sensor probe (Q being the quality factor of the sensor probe), and (b) not below the frequency $\omega_L=R^*/L$ where $R^*$ is the sum of the source impedance from which the sensor probe is driven and its resistance, and L is its inductance.

Preferably, Q may be between 2 and 20. Other values of Q may be used such as below 50 and between 10 and 20, for example and the Q may vary depending on the operating conditions of the sensor system.

Optionally, the detector may be further arranged to indicate target clearance from the change in impedance. The target sensor may also be configured to provide an indication of a speed of rotation of the targets. This may be achieved by detecting the frequency of the change of impedance or other electrical characteristic brought about by the passing of targets, for example.

Optionally, the detector may be further arranged to indicate that the target clearance is within a range of clearances.

Optionally, the control circuitry may be further configured to determine at intervals the resonance frequency of the sensor probe. This may improve accuracy by calibrating the device at intervals or when the targets are stationary.

Optionally, the detector may further detect the real and imaginary components of the impedance of the sensor probe.

Preferably, the target sensor may further comprise a validation circuit configured to apply a DC continuity current to the sensor probe. This may provide an indication that the sensor probe is functioning and undamaged, providing validation to the results.

According to a second aspect there is provided an aero engine comprising the target sensor according to any previous claim.

According to a third aspect there is provided a system comprising: a plurality of the target sensor according to any previous claim; a single transmission line configured to provide an electrical connection between each sensor probe and its corresponding oscillator, wherein each oscillator is configured to drive its corresponding target sensor at a different frequency. Therefore, an array or arrangement of several sensors may be used with reduced cabling.

Preferably, the system may further comprise a multiplexor arranged to maintain the electrical connection within the single transmission line.

According to a fourth aspect there is provided a method of sensing a target comprising the steps of: providing a sensor probe having a resonance frequency that changes as the separation of the sensor probe and the target changes; driving the sensor probe with a radio frequency (RF), signal regulated to a frequency below the resonance frequency of the sensor probe; and detecting an electrical characteristic that varies with the impedance of the sensor probe indicating an interaction of the sensor probe with the target.

Preferably, the RF signal may be regulated to a constant frequency.

Optionally, detecting the electrical characteristic further comprises detecting changes in amplitude of the RF signal at the regulated frequency.

Advantageously, the frequency of the RF signal may be similar to but not more than that which coincides with the greatest rate of change of impedance and/or admittance with frequency of the sensor probe below its resonance frequency. This may improve sensitivity, range and/or signal-to-noise.

Optionally, the method may further comprise the step of determining the resonance frequency of the sensor probe in the absence of the target and configuring the RF signal to a frequency below this determined resonance frequency.

Optionally, the frequency of the RF signal may be between 100 kHz and 400 MHz

Preferably the RF signal is at a frequency which is, for (preferably) all operating conditions and both in the presence and absence of interaction between the sensor probe and a target, simultaneously: (a) not less than $\omega_0/Q$ below the resonance frequency $\omega_0$ of the sensor probe (Q being the quality factor of the sensor probe), and (b) not below the frequency $\omega_L=R^*/L$ where $R^*$ is the sum of the source impedance from which the sensor probe is driven and its resistance, and L is its inductance.

The target may be selected from the group consisting of: rotor blade, rotor, surface, conductive surface, pipe, gas pipe, oil pipe, water pipe, tubing or well casing. The target may be any other object either static or movable. The target sensor may be configured to move relative to the target or the target may move with the target sensor static.

Optionally, Q may be between 2 and 20.

The method described above may be implemented as a computer program comprising program instructions to operate a computer, processor or integrated circuit. The computer program may be stored on a computer-readable medium or stored as firmware.

It should be noted that any feature described above may be used with any particular aspect or embodiment of the invention.

BRIEF DESCRIPTION OF THE FIGURES

The present invention may be put into practice in a number of ways and embodiments will now be described by way of example only and with reference to the accompanying drawings, in which:

FIG. 3 shows a more detailed schematic diagram of the drive electronics indicated in FIG. 2a;

FIG. 4a shows a schematic diagram of an equivalent circuit of the probe of FIG. 2a.

FIG. 4b shows a second schematic diagram of an equivalent circuit of the probe of FIG. 2a.

It should be noted that the figures are illustrated for simplicity and are not necessarily drawn to scale.

DETAILED DESCRIPTION OF THE PREFERRED EMBODIMENTS

Figure 1:
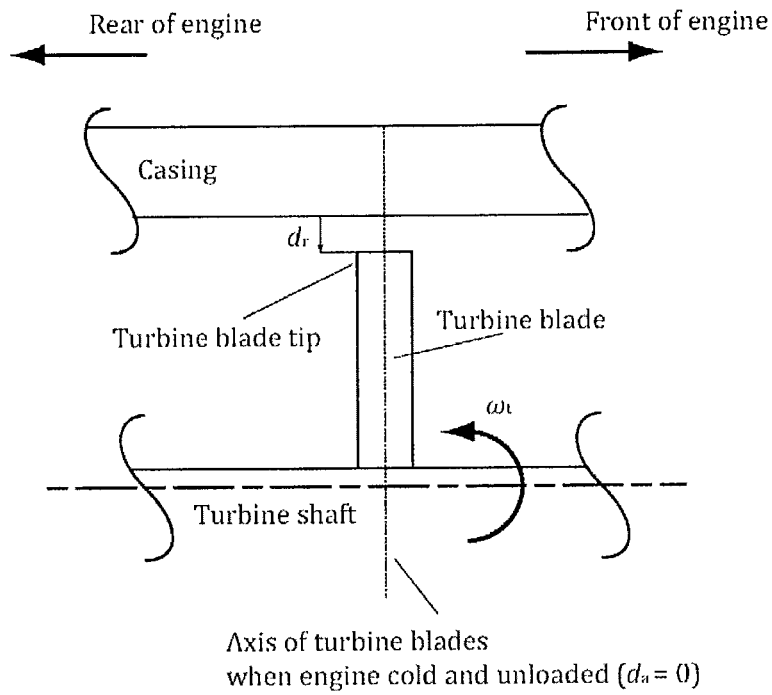
FIG. 1a shows a schematic diagram in cross section of a part of a turbine engine.
FIG. 1b shows a further schematic diagram in cross section of a part of a turbine engine illustrating a shift in rotor blade position.
Figure 1:
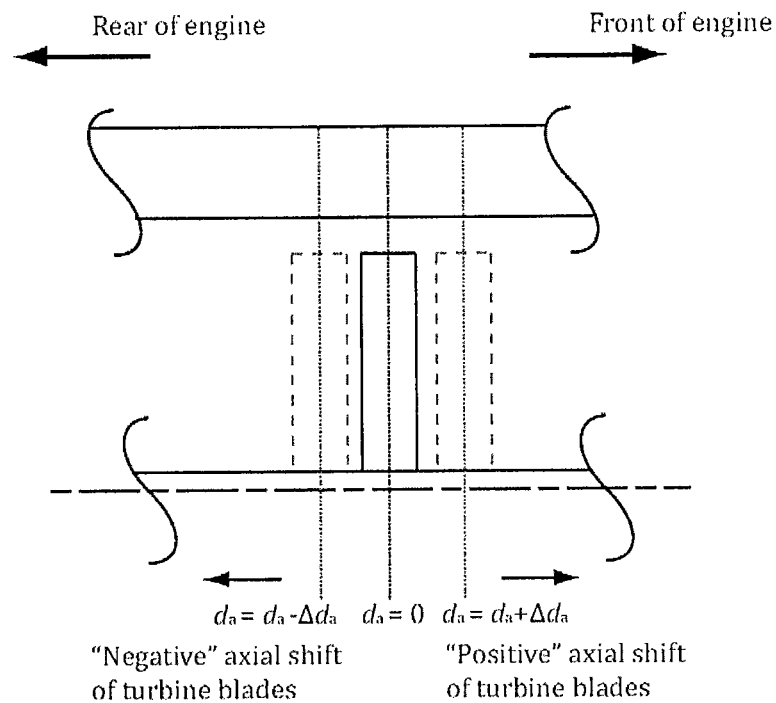
Figure 2:
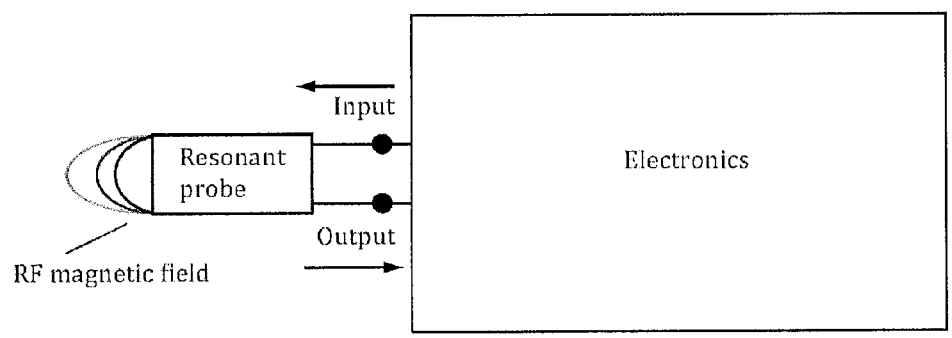
FIG. 2a shows a schematic diagram of a probe and drive electronics.
FIG. 2b shows a schematic diagram of the probe of FIG. 2a in greater detail interacting with a tip of a rotor blade.
Figure 2:
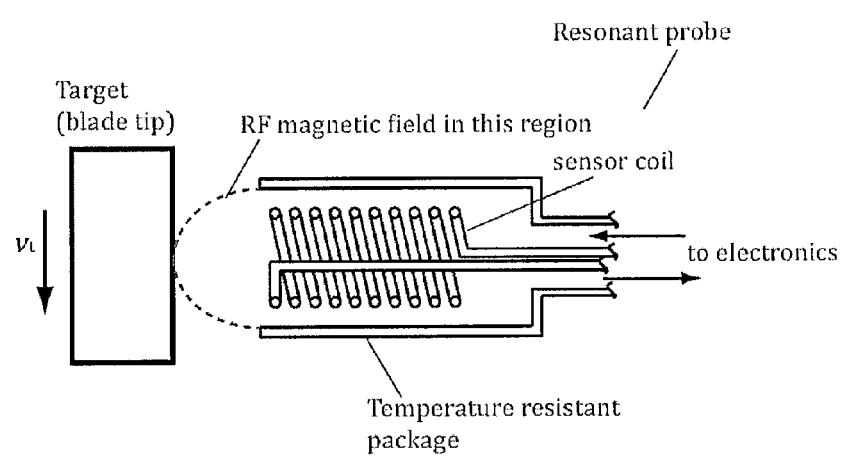

The sensor has two components: an inductive probe ("the probe" or "the resonant probe") and a set of control electronics ("the electronics") (FIG. 2(a)), connected via electrical interconnects (e.g. coaxial transmission line(s)) of arbitrary length. In this section we give an outline description of both.

The Probe

The resonant probe may comprise a coil (the "sensor coil") wound from one or more isolated layers of conducting wire (which might for example be copper or platinum wire) encapsulated in a temperature-resistant package. The sensor coil may be wound on a mandrel. In operation, a radio frequency (RF) current may flow through the coil, giving rise to an RF magnetic field in its vicinity. The package may be designed to partially screen the coil in such a way that when the probe is installed in the engine, its RF magnetic field extends into and only into the region through which the blade tips ("the targets") pass (at the turbine tip velocity $v_t$). One such possible configuration is illustrated in FIG. 2(b) but as will be appreciated by the reader, many others are possible. Further, the dimensions and geometry of the sensor coil and package may be generally chosen such that the cross-sectional area of the RF magnetic field is, at its largest, smaller or significantly smaller than the tip area of an individual blade ("a target") so that at any instant in time the maximum number of individual blade tips in the region of the RF magnetic field is either one or two: the former condition corresponding to case that the blade-tip to blade-tip gap is large in comparison with the characteristic dimension of the RF field, the latter to the case that it is small.

The probe may be engineered to have a particular resonant response having at least one resonance frequency. In one preferred implementation of the sensor invention, this resonant response is wholly or substantially defined by the combination of the self-inductance and inter-winding and layer capacitances of the sensor coil. In another, it may be partly defined by other electrical components or elements (for example lumped capacitors) connected to the coil.

In operation, the resonant probe may be excited at a frequency which lies below but in proximity to its resonance frequency if it has just one such frequency or a particular one of its resonance frequencies (generally, but not necessarily the lowest) if it has multiple such frequencies. From henceforth, when we refer to "the resonance frequency" of the resonant probe, this should be understood to mean "the resonance frequency or the particular resonance frequency" of the resonant probe.

The Sensor Electronics

Figure 3:
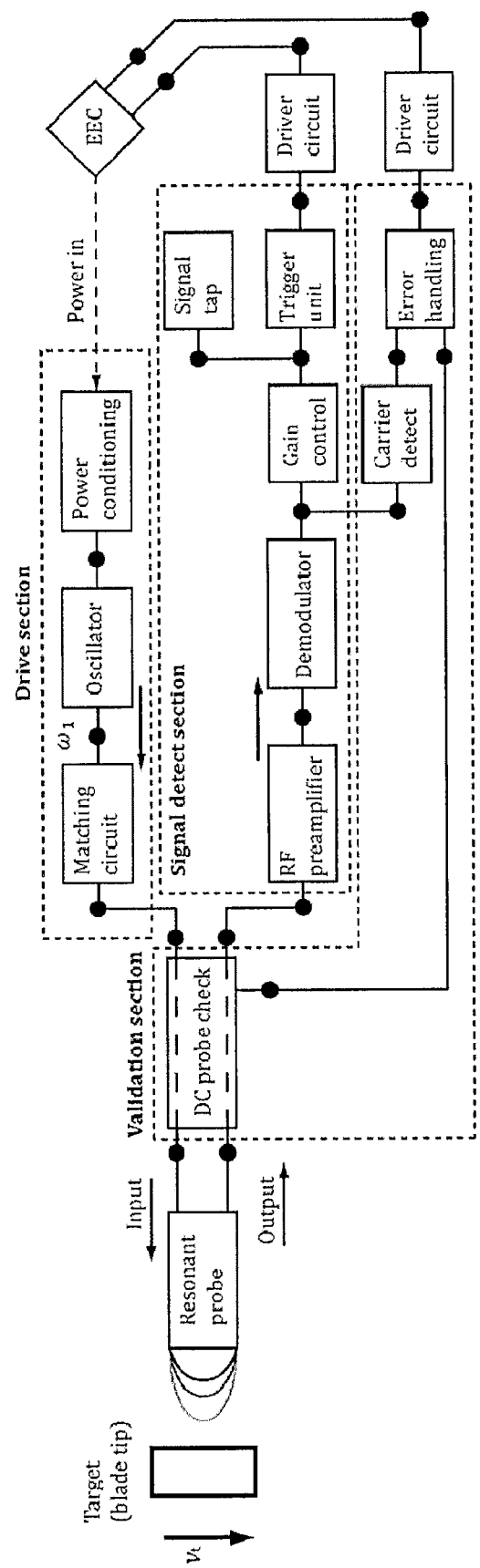

The sensor electronics, illustrated schematically in FIG. 3, may be subdivided into three parts:
1. A "drive" section.
2. A "signal detect" section.
3. A "validation" section.

The "Drive" Section

The role of the drive section is to supply the resonant probe with an RF drive signal. In general, it incorporates two functional elements: an oscillator, and a matching circuit. Examples of additional functional elements which may be present include power conditioning electronics (to set and stabilize the power supply to the electronics) and subsidiary oscillator control circuitry (FIG. 3).

In one preferred implementation of the sensor system, the drive section may produce a drive signal or "probe input signal" at a single fixed frequency $\omega_1$ ("the drive frequency") via, for example, a fixed-frequency crystal oscillator. In another, this frequency may be varied in response to changes in the operating conditions of the resonant probe via a variable frequency oscillator operating in conjunction with a subsidiary control loop. In such a case, the variable frequency oscillator may either have a continuously variable operating frequency, or may be such that it can be operated at a certain plurality of fixed frequencies.

The oscillator may be arranged to operate either continuously or in a pulsed or switched mode. If it is operated in a pulsed mode, the duty cycle of the pulses may be fixed or variable.

A particular feature of the sensor system is that the frequency of the drive signal is always (i.e. under all conditions of operation or use) below the resonance frequency of the resonant probe.

Generally, the drive signal is at a frequency which is, for all operating conditions and both in the presence and absence of interaction between the sensor probe and a target (such as a rotor blade, for example), simultaneously: (a) not less than $\omega_0/Q$ below the resonance frequency $\omega_0$ of the sensor probe (Q being the quality factor of the sensor probe), and (b) not below the frequency $\omega_L = R^*/L$ where $R^*$ is the sum of the source impedance from which the sensor probe is driven and its resistance, and L is its inductance. Q may be between or substantially between 10 and 20, for example. The probe may be configured to have other values of Q and the Q may change depending on the operating conditions of the sensor system.

The matching circuit plays the role of an impedance transformer; it may comprise an assembly of passive or passive and active components having a frequency response such that the power transmission into the resonant probe may be increased or maximized.

The "Signal Detect" Section

The role of the signal detect section is to receive a "probe output signal" from the resonant probe and to derive from this signal a "sensor output signal" indicative of the occurrence and timing of "blade pass events". A "blade pass event" may be defined as a passing of a single blade tip within range of the sensor. As will be explained below, the occurrence of such an event may be signalled by an amplitude modulation of the probe output signal. The closer the blade tip to the sensor, the larger this amplitude modulation. The signal detect section may incorporate at least three functional elements; an amplifier, an amplitude demodulator and a trigger stage.

As will be appreciated by the skilled reader, a wide range of demodulator designs may be employed including for example a diode based envelope detector or coherent detectors (such as might, for example, operate via a multiplication of an amplitude regulated derivative of the raw oscillator output signal with the probe output signal).

The trigger stage may be designed to produce an electrical output of fixed pre-defined level, "level 1" if and only if the signal at the output of the demodulator reaches or exceeds a certain amplitude ("the trigger threshold"). Otherwise, the stage may output a second pre-defined level, "level 0". The trigger threshold may be chosen to be the minimum expected demodulator output amplitude associated with "normal" values of $d_a$ and $d_r$. Thus, the sensor output in response to a normal blade pass event may be a transition from level 0 to level 1 and back to level 0 again. If the turbine blade tips move out of the range of "normal" values of $d_a$ and $d_r$ the trigger will not undergo the transition from level 0 to level 1. Optionally, real-time or post processing of the output from the trigger stage (using either analogue or digital electronics, or a combination of these) may be incorporated. For example, circuitry may be included which is capable of detecting the onset of an intermittent blade detection regime. Such a regime would be expected to occur at the transition between normal and abnormal engine operating conditions.

The "Validation" Section

The role of the validation section is to provide the means to verify that the sensor system is operating normally. Both a DC continuity check of the resonant probe and a measurement to confirm the presence of the carrier may be incorporated.

Operational Features of the Sensor System

Overview of Operational Features of the Sensor System

The operation of the sensor system may be as follows: The drive section of the sensor electronics excites the resonant probe with a radiofrequency signal at a fixed frequency $\omega_1$ chosen to be below the resonance frequency $\omega_0$ of the resonant probe under all operating conditions of the sensor system. In operation, the resonance frequency of the resonant probe may be subject to alteration through two mechanisms:
1. Interaction with the target(s) (which increases its frequency, detailed description follows).
2. Environmental factors, notably temperature (which may increase or decrease its frequency).

Therefore, and particularly, the detuning of the fixed frequency drive signal relative to the resonance frequency of the resonant probe may be chosen to be relatively small but sufficiently large that the maximum possible downward shift through mechanism (2) cannot cause it to reduce to zero.

Interaction between the RF magnetic field from the resonant probe and the target(s) has two effects. Firstly, as alluded to above, it causes the resonance frequency of the probe to increase. Secondly, it increases the loss in the resonant probe (that is, it reduces its quality or Q-factor). Both of these effects lead to an increase in the admittance of the resonant probe at the driving frequency $\omega_1$ and therefore to an increase in the probe output signal associated with a given amplitude of probe input signal.

Operational Strengths of the Sensor System

In blade-tip clearance measurement applications, closed-loop variable driving frequency sensor systems operating in conjunction with resonant sensor probes excited at resonance have been shown to be advantageous (see for example US2010213929, WO2010082035, WO2010082036, and associated applications). The open-loop sensor system we describe has the following specific advantages over such closed-loop instruments in the context of the blade-tip detection task:
1. The sensor may achieve greater sensitivity and therefore greater range by virtue of the fact that by operating at a fixed or constant frequency below the resonance frequency of the resonant probe, two effects; (i) the modification of the resonance frequency of the resonant probe, and (ii) the modification of the Q of the probe, contribute to a blade-tip detection signal which is an amplitude modulation at the driving frequency. In the case of a closed-loop instrument it may not be possible to co-exploit these two effects: the former will produce a signal in the form of a frequency modulation, the latter an amplitude modulation.
2. The described sensor system shows superior immunity to changes in the conductivity of the target (and is also suitable for use in conjunction with targets having a wide range of conductivities).
3. The sensor has the advantage of reduced complexity. It may be readily adapted to accommodate modifications to hardware such as might be required during the research and development/test bed phase of a prototype aircraft engine, or during the lifetime of a given engine or other turbine.
4. More so than those of a closed loop instrument, the sensor electronics lend themselves to modular design and construction.
5. Signal detection is more straightforward than in the case of a typical closed-loop instrument. The detection problem reduces to amplitude demodulation of a fixed frequency carrier with optimum signal-to-noise ratio (SNR).
6. The sensor system features superior robustness to changes or adjustments to the lengths of the cables connecting the probe to the instrumentation. It is thus suitable for use on production engines as a Line Replaceable Unit (LRU). Either sensor probe or sensor electronics manufactured to appropriate tolerances may be exchanged without the need for calibration or other adjustment.
7. The system may be compatible with frequency multiplexed operation: i.e. signals from multiple sensors on the engine operating at distinct frequencies may be routed down a single transmission line, the bandwidth requirement of each individual channel being low. Multi-channel operating modes may also be exploited for SNR enhancement.

In addition to the advantages highlighted by the comparative features 1-7 above, certain other more general factors motivate the particular design of the open-loop sensor system:

The temperature range over which the sensor is required to operate is typically in excess of 2000 K. The electrical characteristics of any practical inductive or capacitative probe designed for the blade-tip detection task may vary measurably over this range. For the particular described resonant probe, the RF probe admittance at a given frequency varies less strongly with temperature away from the resonance frequency. This is because at resonance small temperature induced changes in the complex admittance of the probe can shift the position of the resonance away from the driving frequency, resulting, for a system of non-negligible Q, in a large change in the system's behaviour. Thus, operating the probe below the resonance frequency allows improved, relatively constant sensitivity (that is a good and relatively constant signal-to-noise ratio, SNR) to be achieved over a wide temperature range.

The sensor system may be capable of operating reliably in the presence of extreme mechanical vibration.

Although the design is not incompatible with additional digital circuitry, such as might, for example, be used to perform data storage and processing on the same piece of circuit board which houses the drive, detect, and validation electronics prior to communication with the aircraft's engine controller (EEC, see FIG. 3), the sensor may be essentially an entirely analogue device. One advantage of the sensor is therefore simplicity; it involves no decision trees or conditional behaviours, has a low core component count, and does not require specialist or complex components which might complicate regulatory issues.

Operating Principles of the Sensor System

Equivalent Circuit Model of the Resonant Probe Assembly

Figure 4:
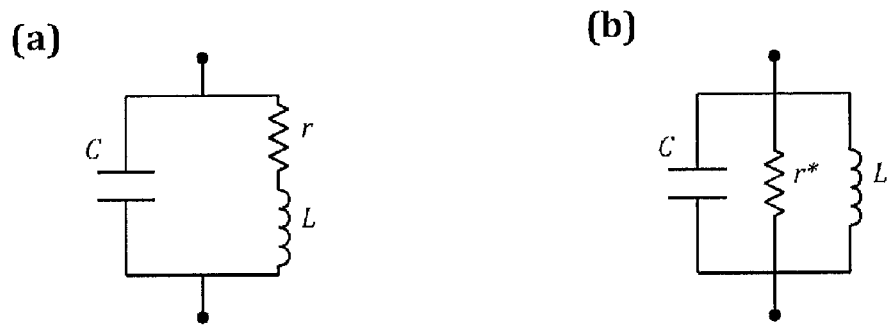

The electrical characteristics of the resonant probe may be analyzed with reference to an equivalent circuit of the form shown in FIG. 4(a). The circuit has three components; an inductance L connected in series with a resistance r in shunt with a capacitance C. L represents the effective inductance of the sensor coil, r its loss equivalent resistance. C is the effective capacitance of the probe (originating from the parasitic capacitance of the sensor coil and any external capacitance). The admittance Y of the circuit at frequency $\omega$ is given, for $wL \gg r$, by $$Y = \frac{1 - \omega^2 LC + j\omega Cr}{r + j\omega L} \quad (1)$$

Equation 1 may be rewritten $$Y = \frac{1}{r^*} + \frac{1}{j\omega L} + j\omega C \quad (2a)$$

where we define a (purely real) "transformed resistance"

$$r^* = \frac{\omega^2 L^2}{r} \quad (2b)$$

By inspection of Eqns. 2, the equivalent circuit of FIG. 4(a) may be redrawn in the form shown in FIG. 4(b): three components, admittances $1/r^*$, $1/j\omega L$ and $j\omega C$ connected in shunt. The resonance frequency $\omega_0$ of the resonant probe is the frequency at which the admittance Y is a minimum:

$$\omega_0 = \frac{1}{\sqrt{LC}} \quad (3)$$

Electrical Characteristics of the Resonant Probe Assembly

The influence of interaction between the resonant probe and a target may be modelled as interaction dependent changes $\Delta L$ and $\Delta r^*$ in the effective inductance and transformed resistance of the equivalent circuit of FIG. 4(b).

Benefits of the system include that the interaction between the resonant probe and the target results in either or both of:

1. A progressive decrease in the effective inductance L with increasing interaction with the target.
2. A progressive decrease in the transformed resistance $r^*$ with increasing interaction with the target.

Both of the effects (1) and (2) above result in a progressive increase in the admittance of the resonant probe with increasing interaction with the target (see Eqns. 2). Thus, whether or not one or both effects are present, interaction between the probe and target produces an unconditional increase in the admittance of the probe. Effects (1) and (2) may be summarized:

$$L' = L - \Delta L(\alpha) \quad (4a)$$

$$\text{sgn}\{\Delta L(\alpha)\} = \text{sgn}\left\{\frac{d\Delta L(\alpha)}{d\alpha}\right\} = +1 \quad (4b)$$

$$r^{*\prime} = r^* - \Delta r^*(\alpha) \quad (5a)$$

$$\text{sgn}\{\Delta r^*(\alpha)\} = \text{sgn}\left\{\frac{d\Delta r^*(\alpha)}{d\alpha}\right\} = +1 \quad (5b)$$

Above, $\alpha$ is an "interaction parameter" which takes a value between 0 (no interaction between probe and target) and +1 (maximum interaction between probe and target). By inspection of Eqns. 2, we see that Eqns. 5 are equivalent to the union of Eqns. 4, with the conditions $$r' = r + \Delta r(\alpha) \quad (6a)$$

$$\text{sgn}\{\Delta r(\alpha)\} = \text{sgn}\left\{\frac{d\Delta r(\alpha)}{d\alpha}\right\} = +1 \quad (6b)$$

Overview of the Operation of the Sensor System

In operation, the resonant probe may be driven by a probe input signal from a fixed or constant frequency source. The frequency of the source $\omega_1$ is chosen to be below the resonance frequency $\omega_0$ of the resonant probe in the absence of interaction with the target for all operating conditions of the sensor system (Eqn. 3) and at a frequency which is not below the frequency $\omega_L = R^*/L$ where $R^*$ is the sum of the source impedance from which the probe is driven and the resistance of the probe. A signal transmitted through the probe may constitute a probe output signal. In the case that a target is present, the amplitude of the output signal is modulated via the change in the admittance of the probe brought about by the probe-target interaction. The stronger the interaction (and therefore, in general, the closer the target to the sensor probe), the more the admittance of the probe is reduced from its original value (Eqns. 4, 5, 6, and 2) and hence the larger the probe output signal amplitude.

The changes in the admittance of the probe responsible for the signal can be considered to be derived from two interlinked but distinct effects:

(i) Modification of the resonance frequency of the resonant probe.
(ii) Modification of the quality factor of the resonant probe.

Of these, (i) dominates in the case of high conductivity targets and (ii) for low conductivity targets.

For the case that Eqns. 4 and 5 hold, the admittance of the resonant probe in the presence of interaction with the target is (from Eqns. 2, 4 and 5)

$$Y' = \frac{1}{r^* - \Delta r^*(\alpha)} + \frac{1}{j\omega(L - \Delta L(\alpha))} + j\omega C \quad (7)$$

Effect on Probe Admittance of Probe-Target Interaction Mediated Changes in the Resonance Frequency of the Resonant Probe From Eqn. 7, it is evident that interaction with the target brings about a shift in the resonance frequency of the resonant probe from its original value $\omega_0$ (Eqn. 3) to a new value $$\omega'_0 = \frac{1}{\sqrt{(L - \Delta L(\alpha))C}} \quad (8)$$

In the limit of small ΔL/L, Eqn. 8 may be written $$\omega'_0(\alpha) = \omega_0 \sqrt{1 + \frac{\Delta L(\alpha)}{L}} \approx \omega_0 \left(1 + \frac{\Delta L(\alpha)}{2L}\right) \quad (9)$$

We can see from Eqn. 9 that the resonance frequency in the presence of probe-target interaction $\omega_0'$ is always larger than $\omega_0$, the resonance frequency in the absence of probe-target interaction.

As alluded to above, the driving frequency of the resonant probe $\omega_1$ is arranged to be below $\omega_0$ in the absence of interaction with the target and may therefore be expressed $$\omega_1 = \omega_0(1-\epsilon), \epsilon > 0 \quad (10)$$

Where $\epsilon$ (a positive real number less than unity) is the "initial detuning"

$$\epsilon = \frac{\omega_0 - \omega_1}{\omega_0} \quad (11)$$

For a given implementation of the sensor, the initial detuning may be chosen via a process of empirical optimization which involves (other ways of determining this initial detuning may be used):

Measuring the amplitude of the sensor output (prior to any triggering stage which may be present) in response to the proximity of a representative conducting target over a range of potential driving frequencies.

Quantifying the change in the electrical characteristics of the resonant probe over the required range of operating temperatures.

In one preferred implementation of the system, a single operating frequency $\omega_1$ may be chosen so as to optimize the sensitivity of the sensor, given environmental constraints. In other, more complex implementations of the sensor system it may be arranged that the frequency at which the resonant probe is driven is varied (using for example a variable frequency crystal oscillator) in response to changes in its temperature (which might for example be determined using a DC conductance measurement). (Note however that in any implementation, the operating frequency is always below the resonance frequency of the sensor probe, both in the absence of, and in the presence of, interaction with the target.)

In the presence of probe-target interaction, the detuning may take a modified value $$\epsilon'(\alpha) = \frac{\omega_0'(\alpha) - \omega_1}{\omega_0(\alpha)'} \quad (12)$$

which, from Eqns. 9 and 10, may be written $$\epsilon'(\alpha) = \epsilon + \frac{\Delta L(\alpha)}{2}(1 - \epsilon) \quad (13)$$

confirming that detuning from resonance increases as the interaction increases, leading to a corresponding increase in the admittance of the resonant probe at $\omega_1$.

Effect on Probe Admittance of Probe-Target Interaction Mediated Changes in the Quality Factor of the Resonant Probe The quality factor Q of the resonant probe in the absence of probe-target interaction may be given by:

$$Q = \frac{\omega_0 L}{r} = \frac{1}{r}\sqrt{\frac{L}{C}} \quad (14)$$

In the presence of interaction, this value may be modified to $$Q'(\alpha) = \frac{\omega_0'(L - \Delta L(\alpha))}{r + \Delta r(\alpha)} \quad (15)$$

which using Eqns. 9 and 14, may be written (in the limit of small ΔL/L)

$$Q'(\alpha) = Q \frac{\left(1 - \frac{\Delta L(\alpha)}{2L}\right)}{\left(1 + \frac{\Delta r(\alpha)}{r}\right)} \quad (16)$$

Thus, probe-target interactions may reduce the effective quality factor of the probe; an effect which leads to a corresponding increase in the admittance of probe at the driving frequency at $\omega_1$.

Net Effect on Probe Admittance of Probe-Target Interaction

Figure 5:
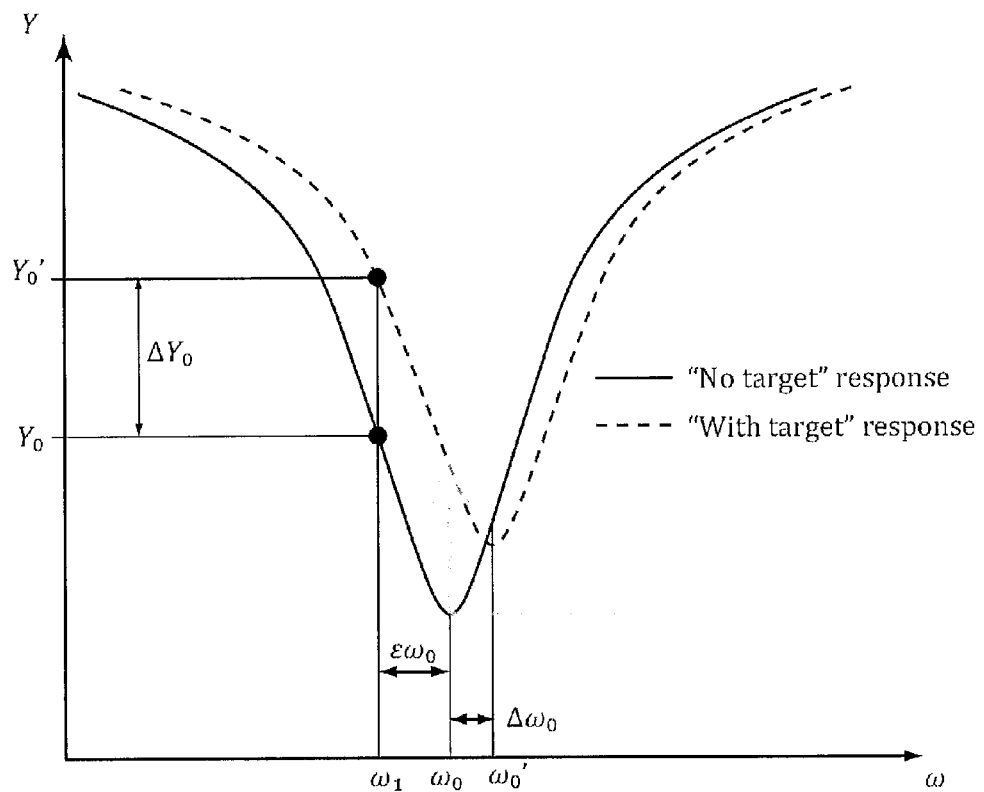
FIG. 5 shows a graph of admittance (y-axis) of the probe of FIG. 2a against frequency (x-axis) with and without a rotor blade in proximity.

FIG. 5 summarizes the effect on the probe admittance of the probe-target interaction. Plotted schematically is the admittance Y of the probe as a function of frequency ω in the region of the resonance at $\omega_0$ for the case that no target is present (solid) and for the case that a target is present (dashed). As indicated by the large grey arrows, the minimum of the admittance moves upward and to the right as a result of interaction with the target. The upward motion is associated with the change in Q of the resonant probe, the rightward motion with the change in its resonance frequency. Both the rightward and upward motion may contribute to a net increase in admittance $\Delta Y_0$.

Physical Origin of the Electrical Characteristics of the Probe Assembly

The physical mechanism responsible for the particular electrical response of the resonant probe outlined above may be a "compression" of the flux emanating from the sensor coil as a result of interaction with the target (see for example WO2007 GB00350 and associated applications). In this explanatory section we present a simple model of this effect with reference to FIG. 6.

Were the sensor coil suspended far from any electrically conducting surfaces, when excited, the instantaneous magnetic field pattern around it would resemble that of a bar magnet; lines of flux would wrap in closed loops around its ends, extending far out into space. However, in the context of the sensor system, the sensor coil is not suspended in free space, but may be surrounded by a cylindrical conducting (generally metallic) screen of radius $R_s$ which may be open at one end (FIG. 6(a)). The thickness $t_s$ of the screen may be arranged to be larger than the skin depth $\delta_1$ at the operating frequency $\omega_1$. That is $$t_s > \delta_1 = \sqrt{\frac{2}{\omega_1 \mu_1 \sigma_1}} \quad (17)$$

where $\mu_1$ and $\sigma_1$ are respectively the permeability and conductivity of the screen material. For practical materials at typical operating frequencies, the condition of Eqn. 17 is readily satisfied with screens having thicknesses of order 1 mm or less. (For example, even for very low conductivity stainless steel; $\sigma_1 \sim 10^6$ Sm$^{-1}$, $\mu_1 \sim \mu_0$, at $\omega_1 = 2\pi \times 30$ MHz, $\delta_1 \sim 0.1$ mm).

The magnetic flux originated by the coil may be accordingly confined by the screen in the direction parallel to its axis.

Figure 6:
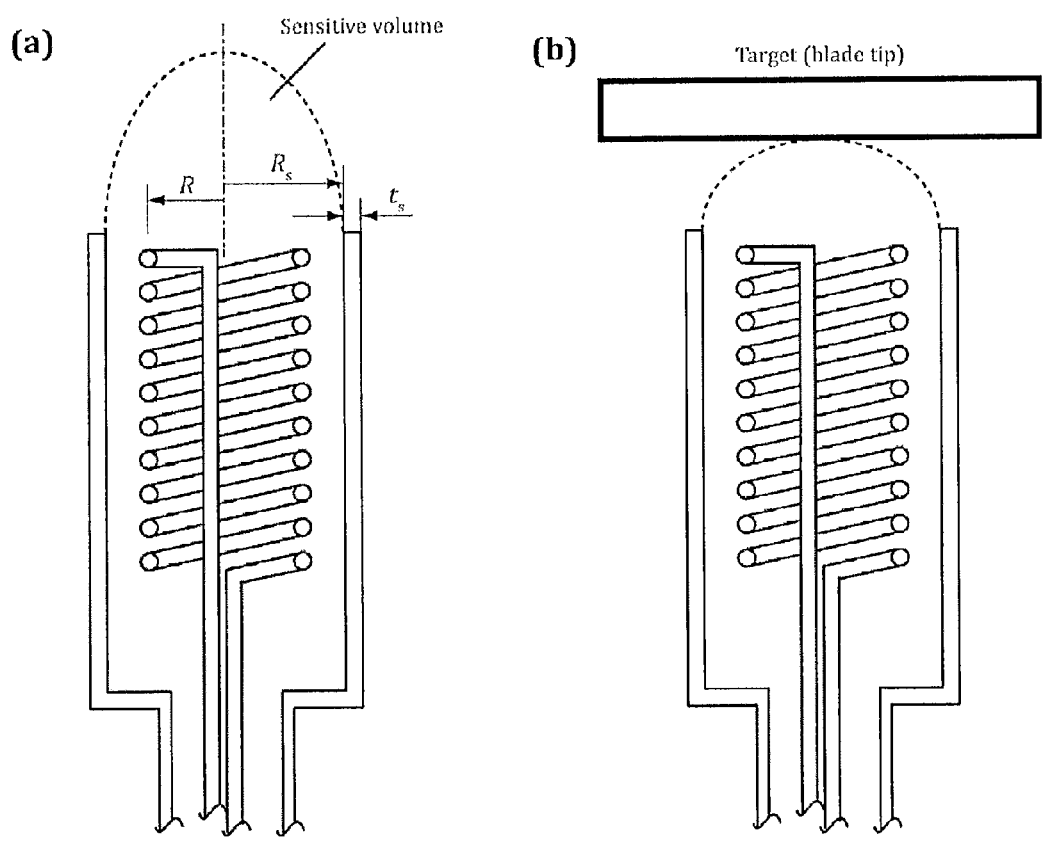
FIG. 6a shows a schematic diagram of the probe of FIG. 2a in cross section including a metallic screen indicating a sensitive volume of space.
FIG. 6b shows a schematic diagram of the probe of FIG. 2a in cross section indicating a sensitive volume of space changing shape when in proximity to the rotor blade.
Figure 7:
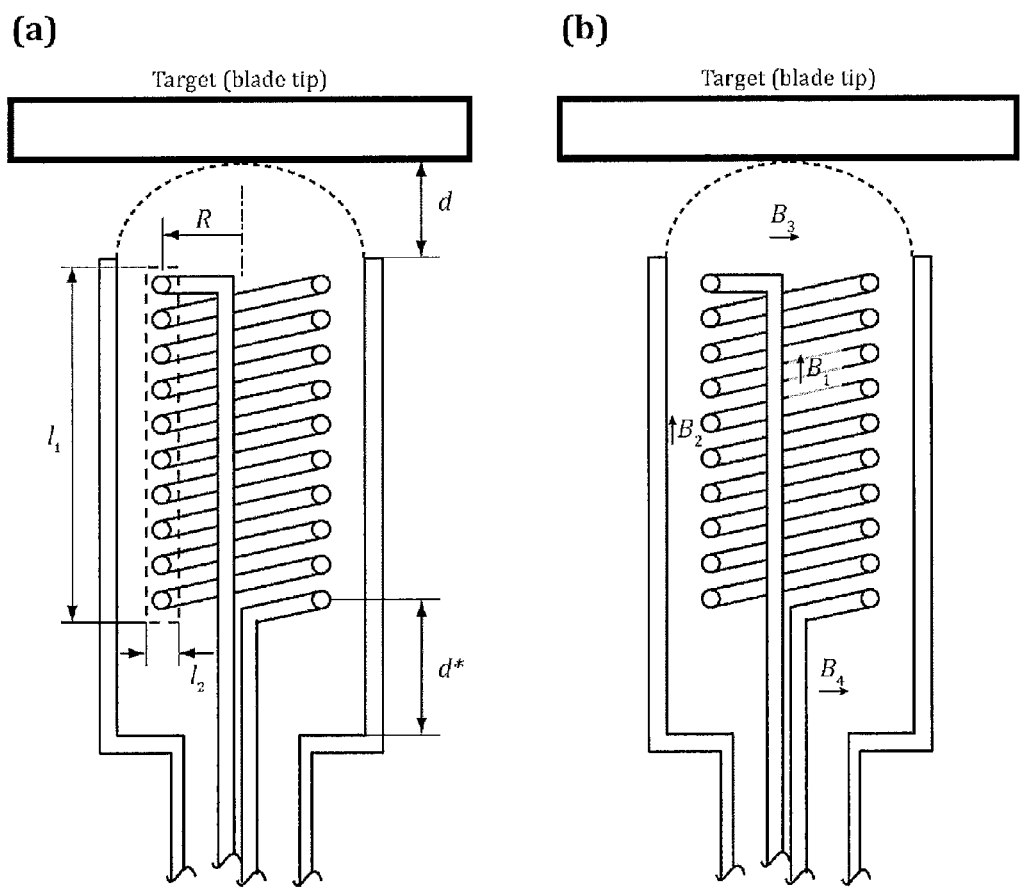
FIG. 7a shows a schematic diagram of the probe of FIG. 2a in cross section indicating the interaction with the rotor blade.
FIG. 7b shows a further schematic diagram of the probe of FIG. 2a in cross section indicating the interaction with the rotor blade.

Analysis of the Operation of the Resonant Probe System Based on a "Flux Compression" Model of Probe-Target Interactivity In the absence of a target, the magnetic flux originated by the coil extends a distance from the unscreened end of the probe which is comparable with its diameter (FIG. 6(a)). The volume occupied by this flux thus defines a finite "sensitive volume". When the target enters the sensitive volume, the effect is—by analogy with the description of the screen above—an axial confinement or "compression" of the magnetic flux (FIG. 6(b)). The effect of this axial compression on the inductance of the coil may be quantified by considering its effect on the magnetic field emanating from the end proximal to the target as the probe-target distance is varied. We elaborate on this description with reference to FIGS. 6 and 7.

FIG. 6 shows a screened coil in the absence of a target (a) and in the presence of (b) a target. As a first step in our analysis we identify a number of important geometrical parameters with reference to FIG. 7(a).

The "coil cross section" $A_1$ is $$A_1 = \pi R^2 \quad (18)$$

where R is the radius of the coil. The "annular cross section" $A_2$ is given by $$A_2 = \pi R_s^2 - A_1 \quad (19)$$

Both $A_1$ and $A_2$ are independent of probe-target interaction. The relationship between the current I flowing in the coil and the magnetic field must, by Maxwell's relations, satisfy $$\frac{1}{\mu_0} \oint B \, dl = NI \quad (20)$$

where N is the number of turns on the coil and we make the simplifying assumption that the magnetic permeability in the system is everywhere equal to that of free space, $\mu_0$.

We now apply the relation of Eqn. 20 to the probe system assuming that a conducting target is positioned a distance d from the unscreened end of the probe (FIGS. 7(a) and 7(b)) and the other end of the coil is screened at a distance d* (note that in general, d* exceeds the maximum value of d). We can evaluate the integral around a rectangular contour of dimensions $l_1$ (axial) by $l_2$ (radial) where $l_1$ is the length of the coil and $l_2$ is approximately $2r_w$, where $r_w$ is the radius of the wire from which the coil is wound, to obtain $$\frac{1}{\mu_0} \{(B_1 + B_2)l_1 + (B_3 + B_4)l_2\} = NI \quad (21)$$

Here, we assume that along the part of the contour through the centre of the coil the field takes a value $B_1$, along the part of the contour through the annular region between the coil and the screen, a value $B_2$ (both $B_1$ and $B_2$ being directed along the coil axis), and along the two short sides of the contour values $B_3$ (target end) and $B_4$ (screened end) (see FIG. 7(b)). $B_3$ and $B_4$ are directed perpendicular to the axis of the coil and are associated with what is commonly referred to as "end effects" (and would be zero for a coil of infinite length).

From the condition $\nabla \cdot B = 0$ we can write $$B_1 A_1 = B_2 A_2 = 2\pi R d B_3 = 2\pi R d^* B_4 \quad (22)$$

Combining Eqns. (21) and (22), we obtain an expression for the magnetic field $B_1$ as a function of the probe-target distance d solely in terms of the coil geometry $$B_1(\alpha) = \frac{\mu_0 NI}{\left(1 + \frac{A_1}{A_2}\right)l_1 + \frac{A_1}{2\pi R}\left(\frac{1}{d} + \frac{1}{d^*}\right)l_2} \quad (23)$$

Finally, from the definition of inductance we have $$L - \Delta L(\alpha) = \frac{\mu_0 N^2 A_1}{\left(1 + \frac{A_1}{A_2}\right)l_1 + \frac{A_1}{2\pi R}\left(\frac{1}{d} + \frac{1}{d^*}\right)l_2} \quad (24)$$

Note that the form of the expression on the right hand side of Eqn. 24 directly implies the minus sign applied to the $\Delta L(\alpha)$ term on the left i.e. the reduction in inductance with decreasing probe-target distance d alluded to in previous sections.

The change in loss-equivalent resistance $\Delta r(\alpha)$ of the probe associated with probe-target interaction results from the current density $\Delta J_t(\alpha)$ produced in the target by the coil's alternating magnetic field:

$$l_\alpha^2 \Delta r(\alpha) \propto \Delta J_t(\alpha)^2 \delta_t \quad (25)$$

where $$\delta_t = \sqrt{\frac{2}{\omega_1 \mu_t \sigma_t}}$$

is the skin depth in the target (permeability $\mu_t$, conductivity $\sigma_t$). The stronger the interaction, the higher the current density (or in other words, $\Delta J_t(\alpha)$ increases in magnitude as $\alpha$ increases) leading directly to the result summarized by Eqns. 6.

As will be appreciated by the skilled person, details of the above embodiment may be varied without departing from the scope of the present invention, as defined by the appended claims.

For example, although the apparatus and method have been described with reference to detecting rotor blades in engine turbines they may be used with any type of rotor blade such as gas turbines and turbos, etc.

Furthermore, the target may be any of: a rotor blade, surface (including those that have low conductivities), conductive surface, pipe, gas pipe, oil pipe, water pipe, tubing or well casing. For example, the target sensor may be used as a tool for downhole pipe inspection, corrosion or erosion detection, casing or tubing condition evaluation, casing collar location, crack detection and well integrity evaluation especially in the oil and gas industry. In these applications the tool may monitor the surface condition and changes associated with wear, corrosion and eventual failure. Such a tool may work on the inside or outside surfaces of pipes or tubes, for example. This tool works especially well on metallic surfaces and other conductors.

Many combinations, modifications, or alterations to the features of the above embodiments will be readily apparent to the skilled person and are intended to form part of the invention. Any of the features described specifically relating to one embodiment or example may be used in any other embodiment by making the appropriate changes.

The invention claimed is:

1. A target sensor comprising:
   a sensor probe having a resonance frequency that changes as the separation of the sensor probe and a target changes;
   an oscillator arranged to apply a radio frequency (RF) signal to the sensor probe, the oscillator having:
   control circuitry configured to regulate the frequency of the RF signal applied to the sensor probe to a regulated frequency which is, both in the presence and absence of interaction between the sensor probe and a target, simultaneously: (a) not less than $\omega_0/Q$ below the resonance frequency $\omega_0$ of the sensor probe (Q being the quality factor of the sensor probe), and (b) not below the frequency $\omega_L = R^*/L$ where $R^*$ is the sum of the source impedance from which the sensor probe is driven and its resistance, and L is its inductance; and a detector arranged to detect an electrical characteristic of the oscillator that varies with the impedance of the sensor probe indicating an interaction of the sensor probe with the target.

2. The target sensor of claim 1 further comprising a circuit arranged to determine the resonance frequency of the sensor probe.

3. The target sensor of claim 1, wherein the control circuitry is further configured to regulate the frequency of the RF signal to a constant frequency.

4. The target sensor according to claim 1, wherein the detector is an amplitude modulation detector.

5. The target sensor according to claim 1, wherein the electrical characteristic is selected from the group consisting of: frequency; amplitude; quality factor, Q; current; and voltage.

6. The target sensor according to claim 1, wherein the control circuitry is configured to regulate the applied RF signal between 1% and 25% below the resonance frequency of the sensor probe.

7. The target sensor according to claim 1, wherein the control circuitry is configured to regulate the applied RF signal between 100 KHz and 400 MHz.

8. The target sensor according to claim 1, wherein the detector is further arranged to indicate target clearance from the change in impedance.

9. The target sensor according to claim 1, wherein the detector is further arranged to indicate that the target clearance is within a range of clearances.

10. The target sensor according claim 1, wherein the detector further detects the real and imaginary components of the impedance of the sensor probe.

11. The target sensor according to claim 1 further comprising a validation circuit configured to apply a DC continuity current to the sensor probe.

12. The target sensor according to claim 1 in which the target is selected from the group consisting of: rotor blade, rotor, surface, conductive surface, pipe, gas pipe, oil pipe, water pipe, tubing or well casing.

13. The target sensor according to claim 1 wherein the target sensor is used within an aero engine.

14. A system comprising:
    a plurality of target sensors each comprising:
    a sensor probe having a resonance frequency that changes as the separation of the sensor probe and a target changes;
    an oscillator arranged to apply a radio frequency (RF) signal to the sensor probe, the oscillator having:
    control circuitry configured to regulate the frequency of the RF signal applied to the sensor probe to a regulated frequency which is, both in the presence and absence of interaction between the sensor probe and a target, simultaneously: (a) not less than $\omega_0/Q$ below the resonance frequency $\omega_0$ of the sensor probe (Q being the quality factor of the sensor probe), and (b) not below the frequency $\omega_L = R^*/L$ where $R^*$ is the sum of the source impedance from which the sensor probe is driven and its resistance, and L is its inductance; and
    a detector arranged to detect an electrical characteristic of the oscillator that varies with the impedance of the sensor probe indicating an interaction of the sensor probe with the target; and
    a single transmission line configured to provide an electrical connection between each sensor probe and its corresponding oscillator, wherein each oscillator is configured to drive its corresponding target sensor at a different frequency.

15. The system of claim 14 further comprising a multiplexor arranged to maintain the electrical connection within the single transmission line.

16. A method of sensing a target comprising the steps of:
    providing a sensor probe having a resonance frequency that changes as the separation of the sensor probe and the target changes;
    driving the sensor probe with a radio frequency, RF, signal regulated to a regulated frequency which is, both in the presence and absence of interaction between the sensor probe and a target, simultaneously: (a) not less than $\omega_0/Q$ below the resonance frequency $\omega_0$ of the sensor probe (Q being the quality factor of the sensor probe), below the frequency $\omega_L = R^*/L$ where $R^*$ is the sum of the source impedance from which the sensor probe is driven and its resistance, and L is its inductance; and
    detecting an electrical characteristic that varies with the impedance of the sensor probe indicating an interaction of the sensor probe with the target such that the target is sensed.

17. The method of claim 16, wherein the RF signal is regulated to a constant frequency.

18. The method of claim 16, wherein detecting the electrical characteristic further comprises detecting changes in amplitude of the RF signal at the regulated frequency.

* * * * *